(12) United States Patent
Heffels (10) Patent No.: US 10,473,313 B2
(45) Date of Patent: Nov. 12, 2019

(54) FLEXIBLE ELECTRICAL COUPLING DEVICE FOR A LIGHTING SYSTEM

(71) Applicant: Lumileds Holding B.V., Schiphol (NL)

(72) Inventor: Wilbert Heffels, Middelburg (NL)

(73) Assignee: LUMILEDS HOLDING B.V., Schiphol (NL)

( * ) Notice: Subject to any disclaimer, the term of this patent is extended or adjusted under 35 U.S.C. 154(b) by 0 days.

(21) Appl. No.: 16/134,555

(22) Filed: Sep. 18, 2018

(65) Prior Publication Data

US 2019/0234596 A1    Aug. 1, 2019

(30) Foreign Application Priority Data

Jan. 29, 2018  (EP) .................................... 18153872

(51) Int. Cl.
*F21V 23/00* (2015.01)
*F21V 29/71* (2015.01)
*F21Y 115/10* (2016.01)

(52) U.S. Cl.
CPC ............ *F21V 23/002* (2013.01); *F21V 29/71* (2015.01); *F21Y 2115/10* (2016.08)

(58) Field of Classification Search
CPC .... F21V 23/002; F21V 29/71; F21Y 2115/10; F21Y 2103/10; F21S 4/00; F21S 4/20; F21S 4/22; F21S 4/24; F21S 4/26
See application file for complete search history.

(56) References Cited

U.S. PATENT DOCUMENTS

| 4,954,095 A | 9/1990 | Cogan |
| 7,034,230 B2 * | 4/2006 | Fan ........................... F21S 4/24 174/117 F |
| 2005/0180162 A1 | 8/2005 | Fan |
| 2013/0094224 A1 * | 4/2013 | Miyatake ................ F21V 21/02 362/363 |

FOREIGN PATENT DOCUMENTS

| EP | 2418417 A2 | 2/2012 |
| EP | 2418417 A3 | 2/2012 |
| WO | 2007/047398 A2 | 4/2007 |
| WO | 2007/047398 A3 | 4/2007 |

* cited by examiner

*Primary Examiner* — Bao Q Truong
(74) *Attorney, Agent, or Firm* — Volpe and Koenig, P.C.

(57) ABSTRACT

An electrical coupling device for coupling functional elements of a lighting system comprises a first wire, a second wire, at least one spacer and at least one coupling spacer. The spacer is arranged to provide a first defined distance between the first and second wires at the position of the spacer. The coupling spacer is arranged to provide a second defined distance between the first and second wires at the position of the coupling spacer and to electrically couple the functional element to the electrical coupling device. Wherein the spacer and the coupling spacer are physically separated from each other, and the coupling spacer, the spacer, and the first and second wires are embedded in a flexible cover. The flexible cover enables flexibility in all three dimensions at a position between the spacer and the coupling spacer. Further a lighting system may comprise the electrical coupling device and functional element.

13 Claims, 7 Drawing Sheets

FLEXIBLE ELECTRICAL COUPLING DEVICE FOR A LIGHTING SYSTEM

FIELD OF THE INVENTION

The invention relates to an electrical coupling device arranged to couple functional elements of a lighting system. The invention further relates to a lighting system comprising the electrical coupling device and functional elements. The functional elements may comprise light emitting diodes.

BACKGROUND OF THE INVENTION

High luminance flexible LED-based lighting systems suffer from a lack of flexibility. Furthermore, reliability of such lighting systems may be an issue.

SUMMARY OF THE INVENTION

It is an object of the present invention to provide an electrical coupling device to enable a flexible lighting system with improved reliability.

The invention is defined by the independent claims. The dependent claims define advantageous embodiments.

According to a first aspect an electrical coupling device arranged to couple functional elements of a lighting system is provided. The electrical coupling device comprises a first wire, a second wire, at least one spacer and at least one coupling spacer. The at least one spacer is arranged to provide a first defined distance between the first wire and the second wire at the position of the spacer. The coupling spacer is arranged to provide a second defined distance between the first wire and the second wire at the position of the coupling spacer. The coupling spacer is further arranged to electrically couple the functional element to the electrically coupling device. The at least one spacer and the coupling spacer are physically separated from each other. The at least one coupling spacer, the at least one spacer, the first wire and the second wire are embedded in a flexible cover. The flexible cover in combination with arrangement of the coupling spacer, the at least one spacer, the first wire and the second wire enables bending in all three dimensions at a position between the at least one spacer and the at least one coupling spacer. The electrical coupling device may enable bending with a minimum radius of curvature of as low as 10 mm can be achieved by the electrical coupling device.

The electrical coupling device may comprise two, three, four or more spacers physically separated from each other. The flexible cover provides a reliable electrical isolation between the two wires by separating the wires from each other. The arrangement of the two spacers and the two wires embedded in the flexible cover enables bending in all three dimensions at a position between the at least two spacers. The spacers and coupling spacers on the other side provide sufficient stability of the electrical coupling device to enable reliable installation of a lighting system comprising one, two, three, four or more electrical coupling devices. Stiffness of spacers and coupling spacers is therefore much higher in comparison to the flexible cover. The flexible cover may comprise a transparent or translucent highly flexible rubber like, for example, silicone rubber ($SiO_x$), poly siloxane rubber (e.g. liquid silicone rubber such as Wacker Elastosil or Shinetsu Elastomer). The material of the flexible cover may be characterized by a shore hardness varying from 20 to 80 shore A. A matrix material of the spacers and coupling spacers may, for example, comprise plastic material or alternatively an electrically isolating material with a relatively high thermal conductivity of more than 2 W/(mK), more preferably more than 5 W/(mK) and most preferably more than 10 W/(mK). The coupling spacer may alternatively comprise ceramic material with a high thermal conductivity. Furthermore, glass filled or carbon filled plastic materials may be used. The coupling spacer is arranged to provide an electrical connection and a mechanical coupling to the functional element. The coupling spacer may, for example, comprise an electrical and mechanical connector (plug, socket etc.). The coupling spacer may be further arranged to reduce or absorb mechanical stress caused by bending the electrical coupling device. Reduction or absorption of mechanical stress may enable a reliable connection to the functional element. The functional element which can be coupled by the electrical coupling device may be a lighting device which comprises at least one light-emitting diode. The at least one light-emitting diode may be a high power LED with an electrical input power of more than 0.5 W, preferably more than 1 W and a luminous efficiency of more than 80 Lumen per Watt. The functional element may alternatively be an interposer. The first and the second distance may be different or the same.

The coupling spacer may be mechanically coupled to a heat dissipation structure. The heat dissipation structure is arranged to dissipate heat generated by at least one functional element during operation of the lighting system. The heat dissipation structure may comprise a flexible heat conducting material with a heat conductivity of more than 10 W/(mK). The heat dissipation structure may, for example, comprise a metal wire which can be coupled to a heat dissipation element of the functional element. The heat dissipation structure may, for example, be arranged to be coupled to a heatsink of an LED-chip.

The heat dissipation structure may be embedded in the flexible cover. The heat dissipation structure may thermally couple the coupling spacer and at least the spacer arranged next to the coupling spacer. A part of the spacer thermally coupled to the coupling spacer may extend outside the flexible cover. The spacer may be arranged to increase cooling by means of the heat dissipation structure by extending outside the flexible cover. The respective spacer may in this case be characterized by relatively high thermal conductivity as discussed above.

The heat dissipation structure may be arranged to thermally couple a first coupling spacer and a second coupling spacer. The electrical coupling device comprises in this case two coupling spacers and intermediate spacers. The coupling spacers may be connected by means of a metal wire embedded in the flexible cover. The heat dissipation structure may be optionally arranged to provide a data connection between neighboring functional elements. The data connection may be used to transmit control or switching signals between the functional elements. The functional element may, for example, comprise an LED and a corresponding electrical driver. Control signals transmitted by means of the heat dissipation structure (e.g. metal wire) may be used to control the electrical driver and therefore the light emitted by the LED.

The electrical coupling device may further comprise at least one flexibility enhancement device. The flexibility enhancement device is arranged to reduce mechanical stress, especially stress in the longitudinal direction to the first wire and the second wire. The flexibility enhancement device may be arranged to enable bending around a corner. The flexibility enhancement device may, for example, comprise a reservoir with first wire and second wire. The first wire and the second wire may be arranged in a folded arrangement within the flexibility enhancement device. The first wire and the second wire may alternatively be arranged in a coiled arrangement within the flexibility enhancement device. The reservoir of first and second wire may enable bending of the electrical coupling device with smaller radius of curvature around all three axes in comparison to a straight parallel arrangement of the first and second wire.

According to a further aspect a lighting system is provided. The lighting system comprises at least one electrical coupling device and at least one functional element electrically coupled by means of the coupling spacer to the at least one electrical coupling device. The at least one electrical coupling device and the at least one functional element are commonly embedded in the flexible cover. The flexible cover comprises or consists of a translucent material at least at the position of a light emitting functional element. The electrical coupling device may be permanently coupled to the functional element. Electrical contacts of the functional elements may, for example, be adhered (soldered, glued etc.) to the first and the second wire to provide an electrical connection. A heat dissipation structure of the electrical coupling device may be adhered to a heat dissipating element of the functional element. The lighting system may be a high luminance lighting system. Embedding one, two, three or more electrical coupling devices and functional elements (especially light-emitting devices comprising light emitting diodes as described above) which are connected by means of intermediate electrical coupling devices in one flexible cover may increase reliability of the lighting system.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings.

DETAILED DESCRIPTION OF EMBODIMENTS

Various embodiments of the invention will now be described by means of the Figures.

Figure 1:
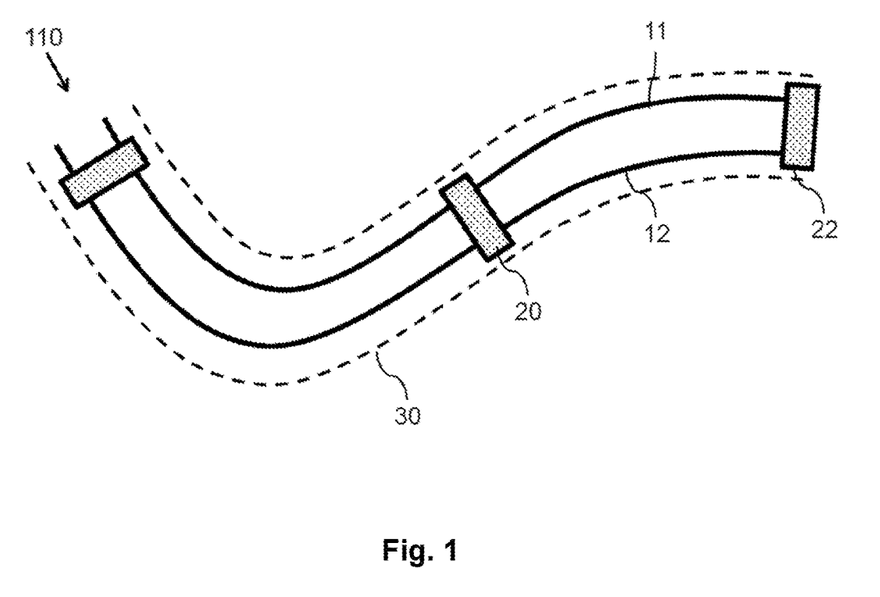
FIG. 1 shows a principal sketch of a first electrical coupling device

FIG. 1 shows a principal sketch of a first electrical coupling device 110. The first electrical coupling device 110 comprises a coupling spacer 22 which is arranged to be coupled to a functional element (not shown). The first electrical coupling device 110 further comprises a first wire 11 and a second wire 12 extending from the coupling spacer 22. The first wire 11 and the second wire 12 are mechanically coupled at intermediate positions by means of spacers 20. The spacers 20 are arranged to provide a defined distance between the first wire 11 and the second wire 12. The distances between the positions of the spacers 20 are preferably identical. The coupling spacer 22, the spacers 20, the first wire and the second wire are embedded in a flexible cover 30 which consists in this embodiment of translucent rubber. The translucent rubber electrically isolates the first wire 11 and the second wire 12 especially when the electrical coupling device is bended. The combination of the first wire 11, the second wire 12, the intermediate spacers 20 and the coupling spacer 22 provides high flexibility between the spacers 20, and between the spacer 20 and the coupling spacer 22. The flexibility is essentially limited by the elasticity of the translucent rubber in combination with the first wire 11 and the second wire 12. The spacers 20 and the coupling spacer 22 limit the forces exerted on the material of the flexible cover by the first wire 11 and the second wire 12 especially if the electrical coupling device 110 is twisted around the longitudinal extension of the electrical coupling device 110.

Figure 2:
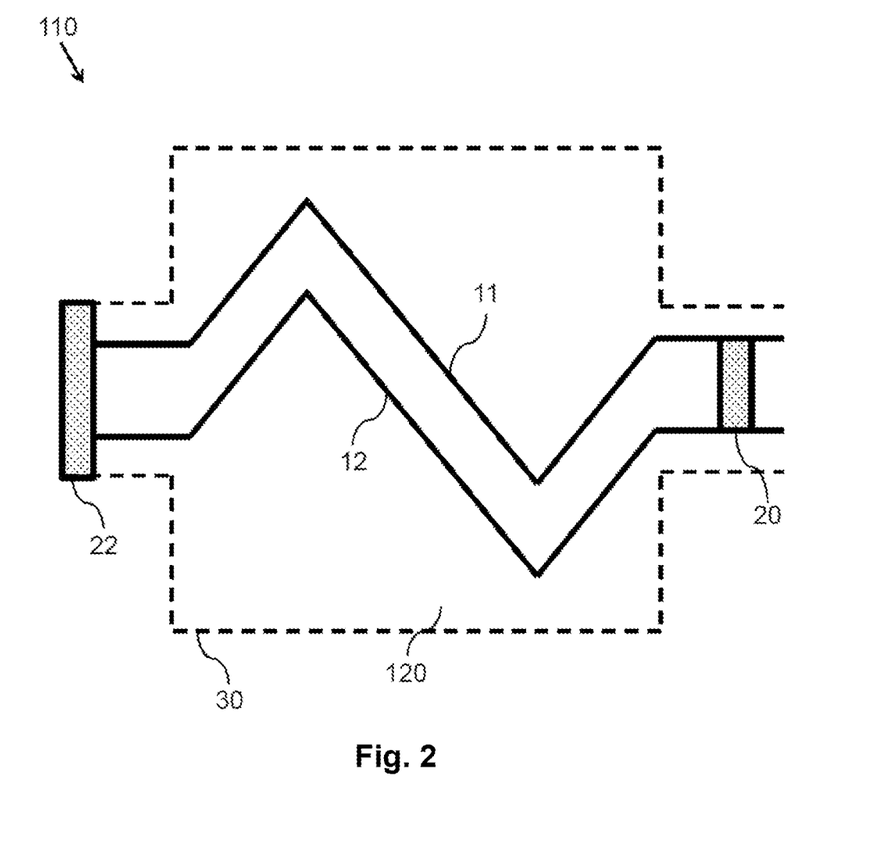
FIG. 2 shows a principal sketch of a second electrical coupling device

FIG. 2 shows a principal sketch of a second electrical coupling device 110. The general configuration of the second electrical coupling device 110 is similar as discussed with respect to FIG. 1. The second electrical coupling device comprises a flexibility enhancement device 120. The flexibility enhancement device 120 comprises a folded arrangement of the first wire 11 and the second wire 12 embedded in the flexible cover 30. A coupling spacer 22 is provided on a first side of the flexibility enhancement device 120 and a spacer 20 is provided on a second side of the flexibility enhancement device 120. The first wire 11 and the second wire 12 are folded parallel to each other in order to provide a reservoir of the first wire 11 and the second wire 12 which may be used to bend the electrical coupling device 110 around corners. The flexibility enhancement device 120 may further reduce forces at an interface between the coupling spacer 22 and a functional element (not shown) which can be coupled to the coupling spacer 22.

Figure 3:
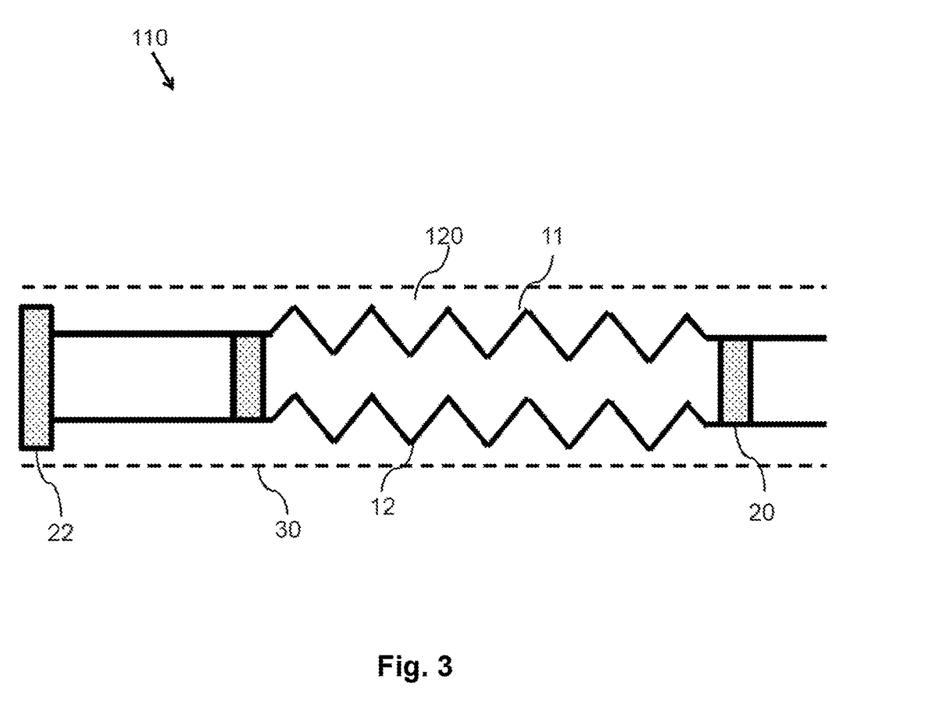
FIG. 3 shows a principal sketch of a third electrical coupling device

FIG. 3 shows a principal sketch of a third electrical coupling device 110. The general arrangement of the third electrical coupling device 110 is similar as discussed with respect to FIGS. 1 and 2. The third electrical coupling device 110 comprises a flexibility enhancement device 120 which is arranged between two spacers 20 mechanically coupling the two wires 11, 12. The first wire 11 and the second wire 12 are each arranged in a folded or zigzag arrangement to provide a reservoir of first wire 11 and second wire 12. The first wire 11 and the second wire 12 may alternatively be arranged in a coiled arrangement. The reservoir of first wire 11 and second wire 12 may enable a small radius of curvature around all three axes of rotation at the position of the reservoir. The small radius of curvature may enable bending of the electrical coupling device around corners without decreasing reliability of the electrical coupling device 110. The flexibility enhancement device 40 may further reduce longitudinal stress.

Figure 4:
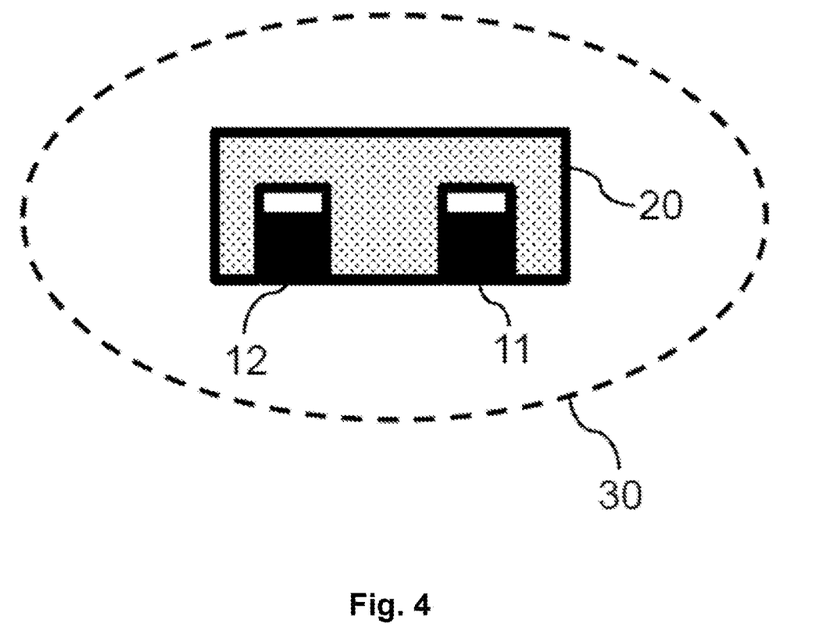
FIG. 4 shows a cross-section through a fourth electrical coupling device across a first spacer
Figure 5:
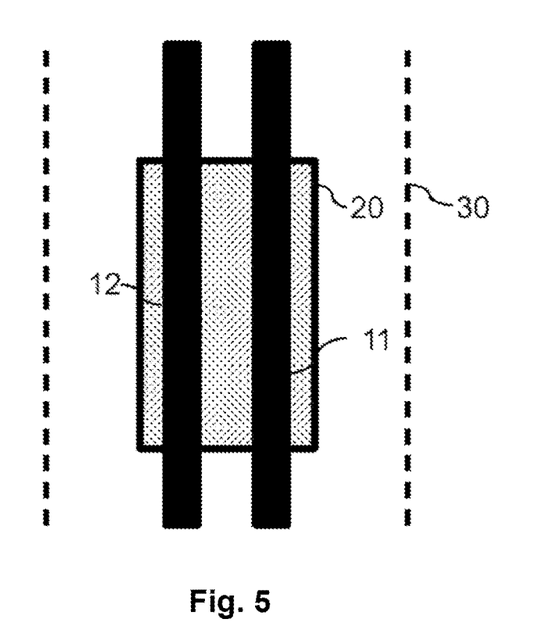
FIG. 5 shows a top view of the first spacer

FIG. 4 shows a cross-section through a fourth electrical coupling device across a first spacer 20. The first spacer 20 consists of plastic comprising two slots in which the first wire and the second wire are clamped. The first spacer 20, the first wire 11 and the second wire are embedded in the flexible cover 30. FIG. 5 shows a top view of the first spacer 20. The first wire 11 and the second wire 12 are clamped parallel to each other such that a defined distance is given between the first wire 11 and the second wire 12 along the longitudinal extension of the first spacer 20.

Figure 6:
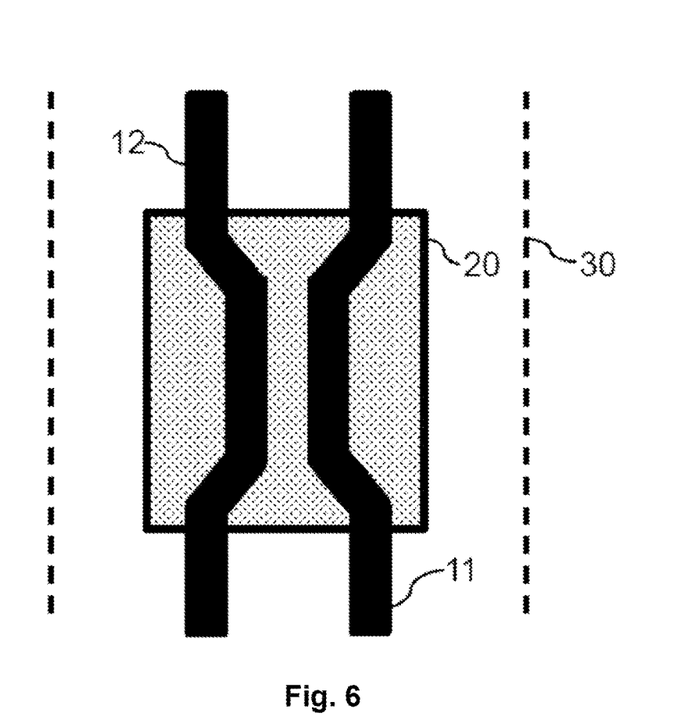
FIG. 6 shows a top view of a second spacer

FIG. 6 shows a top view of a second spacer 20. The general configuration of the second spacer 20 is similar as shown in FIG. 4. The difference is that the first wire 11 and the second wire 12 are buckled along the longitudinal extension of the second spacer 20. Buckling of the first wire 11 and the second wire 12 within the second spacer 20 may reduce or even avoid longitudinal shifts of the second spacer 20 along the longitudinal extension of the first wire 11 and the second wire 12.

Figure 7:
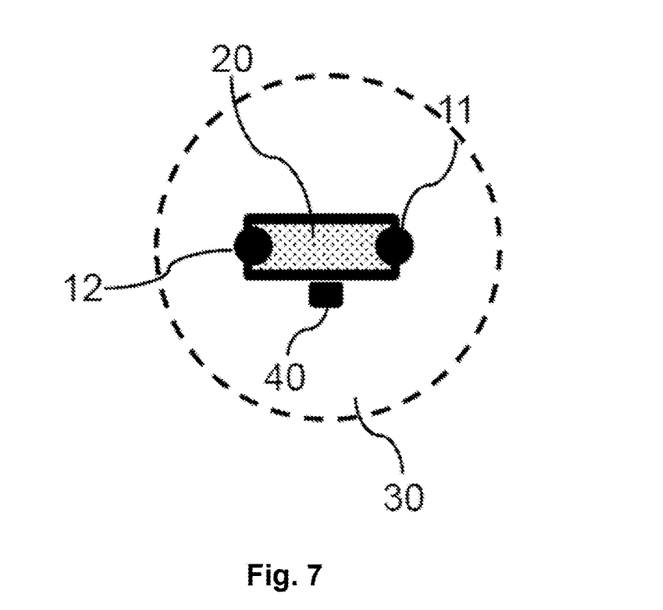
FIG. 7 shows a cross-section through a fifth electrical coupling device across a third spacer

FIG. 7 shows a cross-section through a fifth electrical coupling device across a third spacer 20. The third spacer 20 comprises again two slots which are in this embodiment provided on opposite surfaces of the third spacer 20. The first wire 11 and the second wire 12 are arranged in the slots such that the third spacer 20 separates the first wire 11 from the second wire 12. The cross section further shows a heat dissipation structure 40 which is arranged separate from the third spacer 20. The function of the heat dissipation structure 40 is discussed with respect to FIG. 10.

Figure 8:
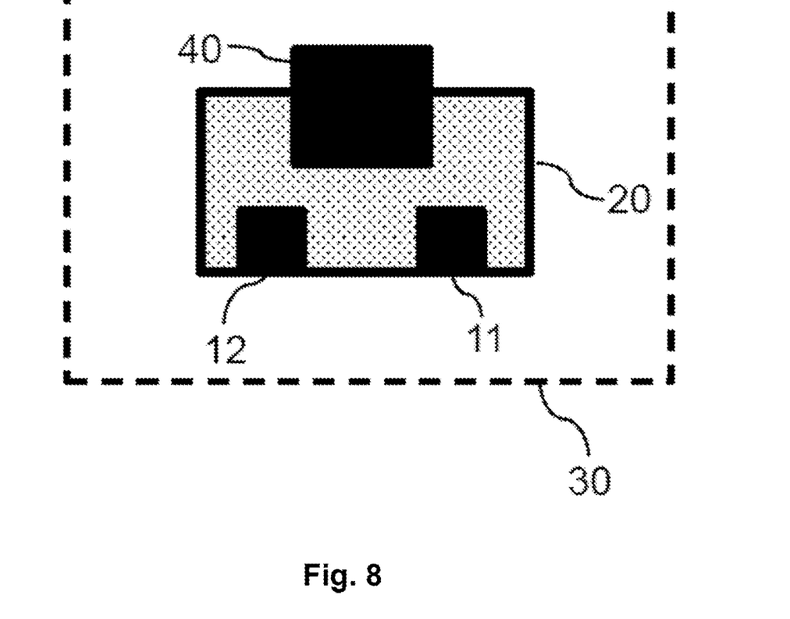
FIG. 8 shows a cross-section through a sixth electrical coupling device across a fourth spacer

FIG. 8 shows a cross-section through a sixth electrical coupling device across a fourth spacer 20. The fourth spacer 20 comprises three slots. Two of the slots are arranged as discussed with respect to FIG. 4 on one side of the fourth spacer 20 to receive the first wire 11 and the second wire 12. The fourth spacer 20 further comprises a further slot arranged on the opposite side of the fourth spacer 20 which is arranged to receive or clamp a heat dissipation structure 40. A cross-section of the flexible cover 30 is in this case rectangular in comparison to the oval or circular cross-section shown in FIGS. 4 and 7.

Figure 9:
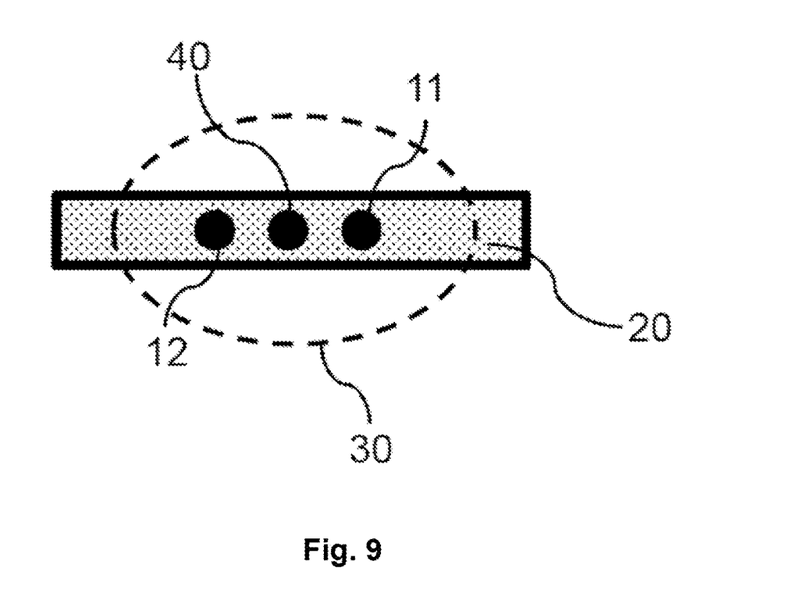
FIG. 9 shows a cross-section through a seventh electrical coupling device across a fifth spacer

FIG. 9 shows a cross-section through a seventh electrical coupling device across a fifth spacer 20. The fifth spacer 20 consists of a ceramic material with a heat conductivity of more than 2 W/(mK). The fifth spacer 20 comprises three holes and partly extends out of the flexible cover 30. The first wire 11, the second wire 12 and a heat dissipation structure 40 are threaded in the holes such that there is a defined distance between the first wire 11, the second wire 12 and the heat dissipation structure 40 along the extension of the fifth spacer 20. The heat dissipation structure 40 consists of a metal wire which can be coupled to a functional element (not shown) by means of a coupling spacer (not shown) to provide a heat sink for the functional element. Heat generated by means of the functional element is dissipated by means of the heat dissipation structure 40 and the fifth spacer 20.

Figure 10:
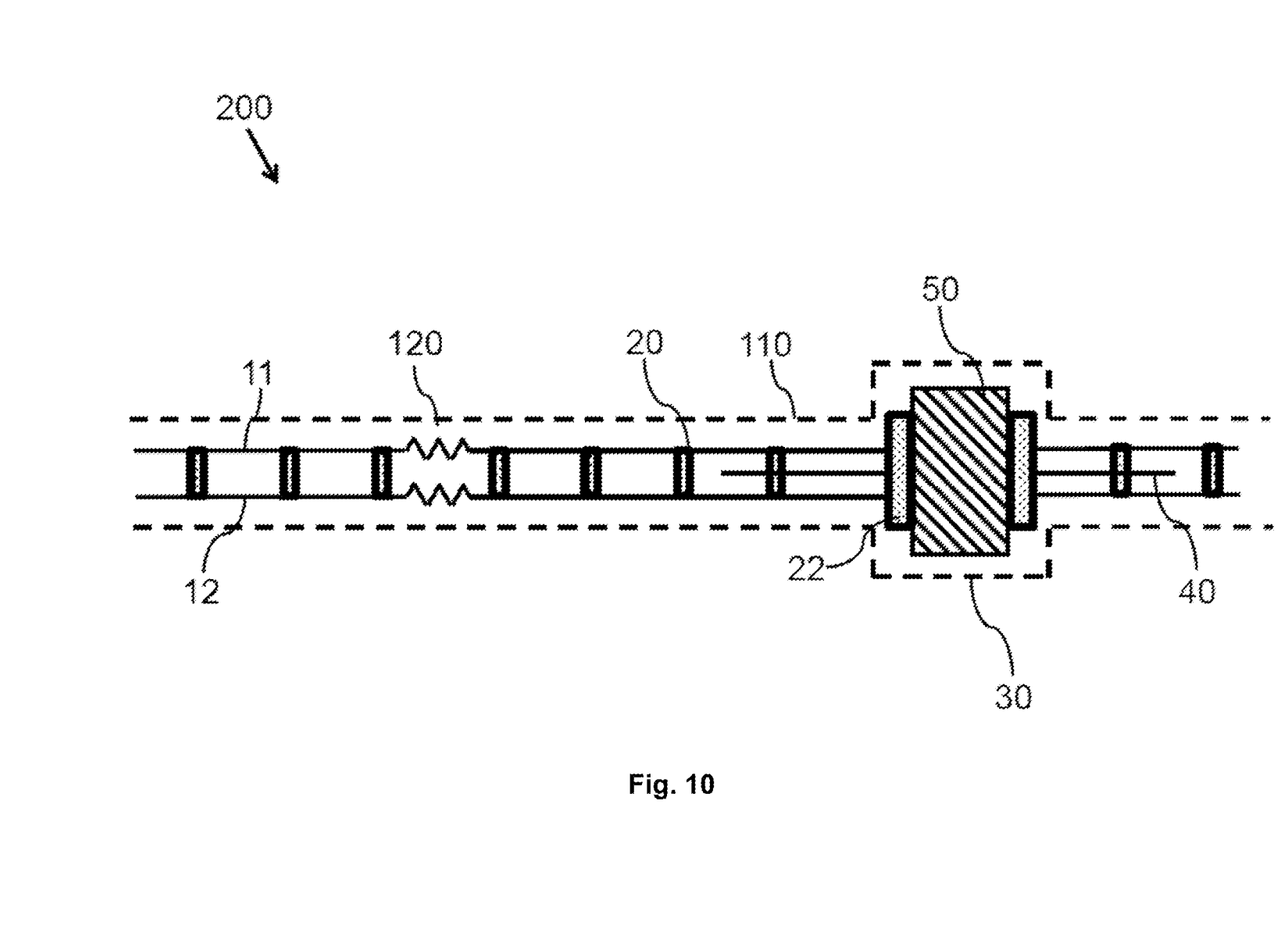
FIG. 10 shows a principal sketch of a first lighting system In the Figures, like numbers refer to like objects throughout. Objects in the Figures are not necessarily drawn to scale.

FIG. 10 shows a principal sketch of a first lighting system 200. The first lighting system 200 comprises two electrical coupling devices 110 which are arranged on the left side and the right side of a functional element 50. The functional element 50 consists in this embodiment of a light emitting diode which is electrically and thermally coupled to the electrical coupling devices 110 by means of coupling spacers 22. Each electrical coupling device 110 comprises a heat dissipation structure 40 which is arranged to dissipate heat generated by the functional element 50. The heat dissipation structures 40 are soldered to heat dissipation elements comprised by the functional element 50 (e.g. heat sink of the LED). The heat dissipation structure 40 extends in this embodiment only beyond the next spacer 20. The first wire 11 and the second wire 12 are soldered to the electrical contacts of the functional element 50 to provide a series or parallel connection of the functional element 50. The electrical coupling device 110 arranged on the left side of the functional element 50 comprises a flexibility enhancement device 120 similar as discussed with respect to FIG. 3. The functional element 50 and the electrical coupling devices 110 are casted in a flexible cover 30 consisting of silicone rubber. Embedding the functional element 50 and the electrical coupling devices 110 in a common flexible cover 30 may increase reliability of the lighting system 200 because of the reduction of interfaces which may, for example, be sensitive with respect to humidity.

The lighting system 20 may comprise a multitude of functional elements 50 which are connected by means of intermediate electrical coupling devices 110. The heat dissipation structure 40 may in an alternative embodiment extend through the whole extension of the lighting system 200 to provide a data connection between the functional elements 50. The lighting system 200 may further comprise a connector to enable electrical connection to an electrical power source. The lighting system 200 may further comprise a central driver which is arranged to electrically drive the functional devices 50. The lighting system 200 may alternatively or in addition comprise local drivers comprised by the functional devices 50. Control signals may be exchanged between the local drivers and/or the central driver and the local drivers by means of the first wire 11, the second wire 12 or the heat dissipation structure 40. The heat dissipation structure 40 may extend through a flexibility enhancement device 120. The heat dissipation structure 40 may in this case be characterized by a folded or coiled arrangement similar as discussed with respect to the first wire 11 and the second wire 12 (see FIGS. 2 and 3 and the corresponding description).

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 11 first wire
12 second wire
20 spacer
22 coupling spacer
30 flexible cover
40 heat dissipation structure
50 functional element
110 electrical coupling device
120 flexibility enhancement device
200 lighting system

The invention claimed is:

1. An electrical coupling device for coupling one or more functional elements of a lighting system, the electrical coupling device comprising:
   a first wire;
   a second wire;
   at least one spacer arranged to provide a first defined distance between the first wire and the second wire at the position of the spacer;
   at least one coupling spacer physically separated from the at least one spacer and arranged to provide a second defined distance between the first wire and the second wire at the position of the coupling spacer and to electrically couple at least one of the one or more functional elements to the electrically coupling device; and
   at least one flexibility enhancement device arranged to reduce mechanical stress to the first wire and the second wire,
   wherein the at least one coupling spacer, the at least one spacer, the first wire and the second wire are embedded in a flexible cover to enable bending in all three dimensions at a position between the at least one spacer and the at least one coupling spacer.

2. The electrical coupling device according to claim 1, wherein the electrical coupling device comprises a second at least one spacer physically separated from the at least one spacer, wherein the electrical coupling device enables bending in all three dimensions at a position between the at least one spacer and the second at least one spacer.

3. The electrical coupling device according to claim 1, wherein the at least one coupling spacer is mechanically coupled to a heat dissipation structure, wherein the heat dissipation structure is arranged to dissipate heat generated by at least one functional elements.

4. The electrical coupling device according to claim 3, wherein the heat dissipation structure is embedded in the flexible cover.

5. The electrical coupling device according to claim 3, wherein the heat dissipation structure thermally couples the at least one coupling spacer and the at least one spacer arranged next to the at least one coupling spacer.

6. The electrical coupling device according to claim 5, wherein the at least one spacer thermally coupled to the coupling spacer partly extends outside the flexible cover.

7. The electrical coupling device according to claim 3, wherein the heat dissipation structure thermally couples the at least one coupling spacer and a second at least one coupling spacer.

8. The electrical coupling device according to claim 7, wherein the heat dissipation structure extends between neighboring functional elements to provide a data connection between the neighboring functional elements.

9. The electrical coupling device according to claim 1, wherein the flexibility enhancement device comprises a reservoir of the first wire and the second wire.

10. The electrical coupling device according to claim 1, wherein the first wire and the second wire are arranged in a folded arrangement within the flexibility enhancement device.

11. The electrical coupling device according to claim 1, wherein the first wire and the second wire are arranged in a coiled arrangement within the flexibility enhancement device.

12. A lighting system comprising:
   at least one electrical coupling device including:
      a first wire;
      a second wire;
      at least one spacer arranged to provide a first defined distance between the first wire and the second wire at the position of the spacer;
      at least one coupling spacer physically separated from the at least one spacer and arranged to provide a second defined distance between the first wire and the second wire at the position of the coupling spacer and to electrically couple at least one of the one or more functional elements to the electrically coupling device; and
      at least one flexibility enhancement device arranged to reduce mechanical stress to the first wire and the second wire,
      wherein the at least one coupling spacer, the at least one spacer, the first wire and the second wire are embedded in a flexible cover to enable bending in all three dimensions at a position between the at least one spacer and the at least one coupling spacer; and
   at least one light emitting functional element electrically coupled to the at least one electrical coupling device by means of the coupling spacer,
   wherein the at least one electrical coupling device and the at least one light emitting functional element are commonly embedded in the flexible cover, and
   wherein the flexible cover comprises a translucent material at least at the position of the at least one light emitting functional element.

13. The lighting system according to claim 12, wherein the at least one light emitting functional element comprises at least one light emitting diode.

* * * * *